(12) United States Patent
Kamikawa et al.

(10) Patent No.: US 8,067,255 B2
(45) Date of Patent: Nov. 29, 2011

(54) NITRIDE SEMICONDUCTOR LIGHT EMITTING DEVICE, METHOD OF MANUFACTURING NITRIDE SEMICONDUCTOR LIGHT EMITTING DEVICE, AND NITRIDE SEMICONDUCTOR TRANSISTOR DEVICE

(75) Inventors: Takeshi Kamikawa, Mihara (JP); Yoshinobu Kawaguchi, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 307 days.

(21) Appl. No.: 12/213,686

(22) Filed: Jun. 23, 2008

(65) Prior Publication Data
US 2009/0075413 A1  Mar. 19, 2009

Related U.S. Application Data

(62) Division of application No. 11/713,761, filed on Mar. 5, 2007, now Pat. No. 7,968,898.

(30) Foreign Application Priority Data

Mar. 6, 2006 (JP) ................................ 2006-059695
Jan. 18, 2007 (JP) ................................ 2007-009282

(51) Int. Cl.
*H01L 21/00* (2006.01)

(52) U.S. Cl. ................ 438/31; 438/26; 438/29; 438/38; 438/46; 438/47; 257/13; 257/79; 257/94; 257/98; 257/E33.025; 257/E33.028; 257/E33.03; 257/E33.033; 257/E33.034; 257/E33.06; 257/E33.067; 257/E33.068; 257/E33.069

(58) Field of Classification Search .................... 438/26, 438/29, 31, 38, 46, 47; 257/13, 79, 94, 98, 257/E33.025, E33.028, E33.03, E33.033, 257/E33.034, E33.06, E33.067, E33.068, 257/E33.069
See application file for complete search history.

(56) References Cited

U.S. PATENT DOCUMENTS

| | | | |
|---|---|---|---|
| 5,196,958 A | 3/1993 | Verbeek et al. |
| 5,231,062 A | 7/1993 | Mathers et al. |
| 5,741,724 A | 4/1998 | Ramdani et al. |
| 5,777,792 A | 7/1998 | Okada et al. |
| 6,249,534 B1 | 6/2001 | Itoh et al. |
| 6,370,177 B1 | 4/2002 | Genei et al. |
| 6,667,187 B2 | 12/2003 | Genei et al. |
| 6,693,935 B2 | 2/2004 | Tojo et al. |
| 6,744,076 B2 | 6/2004 | Fukuyama et al. |
| 6,812,152 B2 | 11/2004 | Lindström et al. |

(Continued)

FOREIGN PATENT DOCUMENTS

CN  1287684  3/2001

(Continued)

OTHER PUBLICATIONS

Office Action for related U.S. Appl. No. 11/638,582 dated Jun. 12, 2008.

(Continued)

*Primary Examiner* — Jay C Kim
(74) *Attorney, Agent, or Firm* — Harness, Dickey & Pierce, P.L.C.

(57) ABSTRACT

Provided are a nitride semiconductor light emitting device including a coat film formed at a light emitting portion and including an aluminum nitride crystal or an aluminum oxynitride crystal, and a method of manufacturing the nitride semiconductor light emitting device. Also provided is a nitride semiconductor transistor device including a nitride semiconductor layer and a gate insulating film which is in contact with the nitride semiconductor layer and includes an aluminium nitride crystal or an aluminum oxynitride crystal.

5 Claims, 5 Drawing Sheets

U.S. PATENT DOCUMENTS

| | | | |
|---|---|---|---|
| 6,961,359 | B2 | 11/2005 | Tojo et al. |
| 7,564,884 | B1 | 7/2009 | Ito et al. |
| 2002/0024981 | A1 | 2/2002 | Tojo et al. |
| 2003/0015713 | A1 | 1/2003 | Yoo |
| 2003/0015715 | A1 | 1/2003 | Sakai |
| 2003/0048823 | A1 | 3/2003 | Yamanaka |
| 2003/0210722 | A1 | 11/2003 | Arakida et al. |
| 2004/0026710 | A1 | 2/2004 | Tsuda et al. |
| 2004/0165635 | A1 | 8/2004 | Sugimoto et al. |
| 2004/0190576 | A1 | 9/2004 | Matsuoka et al. |
| 2004/0213314 | A1 | 10/2004 | Kunitsugu et al. |
| 2004/0238810 | A1 | 12/2004 | Dwilinski et al. |
| 2004/0245535 | A1 | 12/2004 | D'Evelyn et al. |
| 2005/0032344 | A1 | 2/2005 | Hatano et al. |
| 2005/0059181 | A1 | 3/2005 | Yamane et al. |
| 2005/0104162 | A1 | 5/2005 | Xu et al. |
| 2005/0127383 | A1 | 6/2005 | Kikawa et al. |
| 2005/0281304 | A1 | 12/2005 | Mochida |
| 2006/0093005 | A1 | 5/2006 | Okunuki et al. |
| 2006/0133442 | A1 | 6/2006 | Kondou et al. |
| 2007/0014323 | A1 | 1/2007 | Tachibana et al. |
| 2007/0138491 | A1 | 6/2007 | Kawaguchi et al. |
| 2007/0205424 | A1 | 9/2007 | Kamikawa et al. |
| 2007/0210324 | A1 | 9/2007 | Kawaguchi et al. |
| 2007/0246720 | A1 | 10/2007 | Kamikawa et al. |

FOREIGN PATENT DOCUMENTS

| | | |
|---|---|---|
| CN | 151322 | 7/2004 |
| EP | 1 043 765 | 10/2000 |
| JP | 03-049281 | 3/1991 |
| JP | 03-209895 | 9/1991 |
| JP | 09-162496 | 6/1997 |
| JP | 09-194204 | 7/1997 |
| JP | 09-283843 | 10/1997 |
| JP | 2743106 | 2/1998 |
| JP | 2002-100830 | 4/2002 |
| JP | 2002-237648 | 8/2002 |
| JP | 2002-335053 | 11/2002 |
| JP | 2005-175111 A | 6/2005 |
| JP | 2005-340625 | 12/2005 |

OTHER PUBLICATIONS

Office Action for co-pending U.S. Appl. No. 11/638,581 dated Apr. 9, 2008.
Office Action dated Mar. 23, 2009 from copending U.S. Appl. No. 11/638,581.
Office Action dated Dec. 30, 2008 from copending U.S. Appl. No. 11/785,981.
Office Action dated Jun. 4, 2009 from copending U.S. Appl. No. 11/785,981.
Advisory Action dated Aug. 3, 2009 in connection with U.S. Appl. No. 11/638,581.
Office Action dated Aug. 3, 2009 from copending U.S. Appl. No. 11/638,582.
Office Action dated Sep. 25, 2009 from copending U.S. Appl. No. 11/713,760.
Office Action dated Oct. 15, 2009 from copending U.S. Appl. No. 11/638,581.
Office Action dated Oct. 15, 2009 from copending U.S. Appl. No. 12/314,402.
Office Action dated Sep. 22, 2009 from copending U.S. Appl. No. 11/713,761.
Office Action dated Dec. 14, 2009 from copending U.S. Appl. No. 11/785,981.
Advisory Action dated Jan. 12, 2010 from copending U.S. Appl. No. 11/713,761.
Office Action dated Jan. 25, 2010 from copending U.S. Appl. No. 12/153,756.
Office Action dated Jan. 26, 2010 from copending U.S. Appl. No. 11/638,582.
Office Action dated Feb. 26, 2010 from copending U.S. Appl. No. 11/638,581.
Office Action dated Mar. 16, 2010 from copending U.S. Appl. No. 11/713,761.
Advisory Action dated Mar. 23, 2010 from copending U.S. Appl. No. 11/785,981.
Advisory Action dated Apr. 21, 2010 from copending U.S. Appl. No. 11/638,582.
Office Action dated May 24, 2010 from copending U.S. Appl. No. 11/638,581.
Office Action dated May 26, 2010 from copending U.S. Appl. No. 12/382,530.
Office Action dated May 26, 2010 from copending U.S. Appl. No. 12/314,402.
Hartnett, et al., "*Optical properties of ALON (aluminum oxynitride)*", Infrared-Physics & Technology, vol. 39, pp. 203-211 (1998).
Dreer, et al., "*Statistical evaluation of refractive index, growth rate, hardness and Young's modulus of aluminium oxynitride films*", Thin Solid Films, vol. 354, pp. 43-49 (1999).
Office Action dated Jun. 17, 2010 from copending U.S. Appl. No. 12/153,756.
Office Action mailed Oct. 7, 2010 from copending U.S. Appl. No. 12/805,644.
Office Action mailed Oct. 4, 2010 from copending U.S. Appl. No. 11/638,581.
Office Action mailed Oct. 7, 2010 from copending U.S. Appl. No. 12/382,530.
Office Action mailed Oct. 13, 2010 from copending U.S. Appl. No. 12/153,756.
Office Action mailed Oct. 28, 2010 from copending U.S. Appl. No. 11/713,761.
Office Action mailed Nov. 24, 2010 from copending U.S. Appl. No. 12/153,314.
Office Action mailed Dec. 6, 2010 from copending U.S. Appl. No. 12/314,402.
Advisory Action mailed Feb. 18, 2011 from copending U.S. Appl. No. 12/153,314.
Office Action dated Mar. 18, 2011 in co-pending U.S. Appl. No. 12/153,756.
Office Action dated Apr. 22, 2011 in co-pending U.S. Appl. No. 12/382,530.
Office Action dated Apr. 26, 2011 in co-pending U.S. Appl. No. 11/638,581.
Office Action dated May 2, 2011 in co-pending U.S. Appl. No. 12/805,644.
US Office Action dated Jun. 8, 2011 in co-pending U.S. Appl. No. 12/232,525.
US Office Action dated Jun. 23, 2011 in co-pending U.S. Appl. No. 12/314,402.
US Office Action dated Jul. 20, 2011 issued in co-pending U.S. Appl. No. 12/153,756.
US Office Action dated Sep. 2, 2011 issued in co-pending U.S. Appl. No. 11/785,981.
US Office Action dated Aug. 23, 2011 issued in co-pending U.S. Appl. No. 12/153,314.

NITRIDE SEMICONDUCTOR LIGHT EMITTING DEVICE, METHOD OF MANUFACTURING NITRIDE SEMICONDUCTOR LIGHT EMITTING DEVICE, AND NITRIDE SEMICONDUCTOR TRANSISTOR DEVICE

CROSS-REFERENCE TO RELATED APPLICATIONS

This application claims priority under 35 U.S.C. §§120, 121 to and is a divisional application of U.S. patent application entitled, NITRIDE SEMICONDUCTOR LIGHT EMITTING DEVICE, METHOD OF MANUFACTURING NITRIDE SEMICONDUCTOR LIGHT EMITTING DEVICE, AND NITRIDE SEMICONDUCTOR TRANSISTOR DEVICE, and filed Mar. 5, 2007, having Ser. No. 11/713,761 now U.S. Pat. No. 7,968,898, which claims priority to Japanese Patent Application No. 2006-059695, filed with the Japanese Patent Office on Mar. 6, 2006, and Japanese Patent Application No. 2007-009282, filed with the Japanese Patent Office on Jan. 18, 2007, priority is hereby claimed to all of the above mentioned prior filed applications and the contents of which are all hereby incorporated by reference in their entirety.

BACKGROUND OF THE INVENTION

1. Field of the Invention

The present invention relates to a nitride semiconductor light emitting device, a method of manufacturing a nitride semiconductor light emitting device, and a nitride semiconductor transistor device.

2. Description of the Background Art

Generally, among nitride semiconductor light emitting devices, nitride semiconductor laser devices are known for low reliability caused by degradation of light emitting portions. The degradation of a light emitting portion is considered to be caused by excessively generated heat from the light emitting portion due to the presence of a non-radiative recombination level. Oxidation of the light emitting portion is thought to be the main factor for the non-radiative recombination level.

Therefore, for the purpose of preventing oxidation of the light emitting portion, a coat film of alumina ($Al_2O_3$), silicon oxide ($SiO_2$) or the like is formed at the light emitting portion (see for example Japanese Patent Laying-Open No. 2002-335053).

SUMMARY OF THE INVENTION

We have conducted research with the aim of realizing a nitride semiconductor laser device which does not exhibit low reliability caused by degradation of a light emitting portion even at the time of high power driving.

For conventional nitride semiconductor laser devices each having a 80 nm-thick alumina coat film formed at a facet at the light emitting side and having a multi-layer film of silicon oxide film/titanium oxide film formed at a facet at the light reflecting side, with reflectivity of 95%, we conducted two kinds of aging test: an aging test under the conditions of low temperature and low power (30° C., CW drive, optical power 30 mW); and an aging test under the conditions of high temperature and high power (70° C., CW drive, optical power 100 mW). As a result, in the aging test under the conditions of low temperature and low power, the devices operated stably over 3000 hours. In the aging test under the conditions of high temperature and high power, it was observed that many nitride semiconductor laser devices stopped emitting laser light after 400 hours or so, due to COD (Catastrophic Optical Damage) at the light emitting portion. Therefore, in the conventional nitride semiconductor laser device, COD of the light emitting portion was found to be a problem in a relatively short aging time of 400 hours under the conditions of high temperature and high power.

Also in the case where a nitride semiconductor light emitting diode device is driven under the conditions of high temperature and high power, its light emitting surface that is the light emitting portion may be degraded, resulting in deteriorated reliability. Improved reliability is also desired in a nitride semiconductor transistor device such as HFET (Heterostructure Field Effect Transistor) using nitride semiconductor.

An object of the present invention is therefore to provide a nitride semiconductor light emitting device with sufficient reliability even when being driven at high-temperature and high-power and a method of manufacturing the nitride semiconductor light emitting device, and a nitride semiconductor transistor device with improved reliability.

The present invention provides a nitride semiconductor light emitting device including a coat film formed at a light emitting portion. The coat film includes an aluminum nitride crystal or an aluminum oxynitride crystal.

Preferably, in the nitride semiconductor light emitting device of the present invention, the aluminum nitride crystal or the aluminum oxynitride crystal has a crystal axis aligned with that of a nitride semiconductor crystal forming the light emitting portion.

Preferably, in the nitride semiconductor light emitting device of the present invention, a thickness of the coat film is at least 6 nm and at most 150 nm.

Preferably, in the nitride semiconductor light emitting device of the present invention, a film made of an oxide, an oxynitride or a nitride is formed on the coat film.

Preferably, in the nitride semiconductor light emitting device of the present invention, the film made of an oxide on the coat film is an aluminum oxide film, a silicon oxide film, a titanium oxide film, a hafnium oxide film, a zirconium oxide film, a niobium oxide film, a tantalum oxide film, or an yttrium oxide film.

Preferably, in the nitride semiconductor light emitting device of the present invention, the film made of an oxynitride on the coat film is an aluminum oxynitride film or a silicon oxynitride film having a composition different from that of the coat film.

Preferably, in the nitride semiconductor light emitting device of the present invention, the film made of a nitride on the coat film is an aluminum nitride film or a silicon nitride film.

Preferably, in the nitride semiconductor light emitting device of the present invention, a magnesium fluoride film is formed on the coat film.

The nitride semiconductor light emitting device of the present invention is a nitride semiconductor laser device, and the coat film may be formed on a facet at a light emitting side of the nitride semiconductor laser device.

The nitride semiconductor light emitting device of the present invention is a nitride semiconductor light emitting diode device, and the coat film may be formed on a light emitting surface of the nitride semiconductor light emitting diode device.

Here, in the case where the nitride semiconductor light emitting device of the present invention is a nitride semiconductor laser device or a nitride semiconductor light emitting diode device, a substrate made of nitride semiconductor represented by a composition formula of $Al_sGa_tN$ (s+t=1, $0 \leq s \leq 1$, $0 \leq t \leq 1$) is preferably used as a substrate. Here, in the above-noted composition formula, Al represents aluminum, Ga represents gallium, N represents nitrogen, s represents a composition ratio of aluminum, and t represents a composition ratio of gallium.

The present invention also provides a method of manufacturing the nitride semiconductor light emitting device as described above. The method includes the steps of: irradiating the light emitting portion with argon or nitrogen plasma; and after irradiation of the plasma, forming the aluminum nitride crystal or the aluminum oxynitride crystal at the light emitting portion.

Preferably, in the method of manufacturing the nitride semiconductor light emitting device in accordance with the present invention, a formation temperature for the aluminum nitride crystal or a formation temperature for the aluminum oxynitride crystal is at least 200° C.

In the method of manufacturing the nitride semiconductor light emitting device in accordance with the present invention, the aluminum oxynitride crystal can be formed using aluminum oxide for a target as represented by a composition formula of $Al_xO_y$ (0<x<1, 0<y<0.6), where Al represents aluminum, O represents oxygen, x represents a composition ratio of aluminum, and y represents a composition ratio of oxygen.

The present invention additionally provides a nitride semiconductor transistor device including a nitride semiconductor layer and a gate insulating film in contact with the nitride semiconductor layer. The gate insulating film includes an aluminum nitride crystal or an aluminum oxynitride crystal.

Preferably, in the nitride semiconductor transistor device of the present invention, the aluminum nitride crystal or the aluminum oxynitride crystal has a crystal axis aligned with a nitride semiconductor crystal forming the nitride semiconductor layer.

In accordance with the present invention, it is possible to provide a nitride semiconductor light emitting device with sufficient reliability even when being driven at high-temperature and high-power and a method of manufacturing the nitride semiconductor light emitting device, and a nitride semiconductor transistor device with improved reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
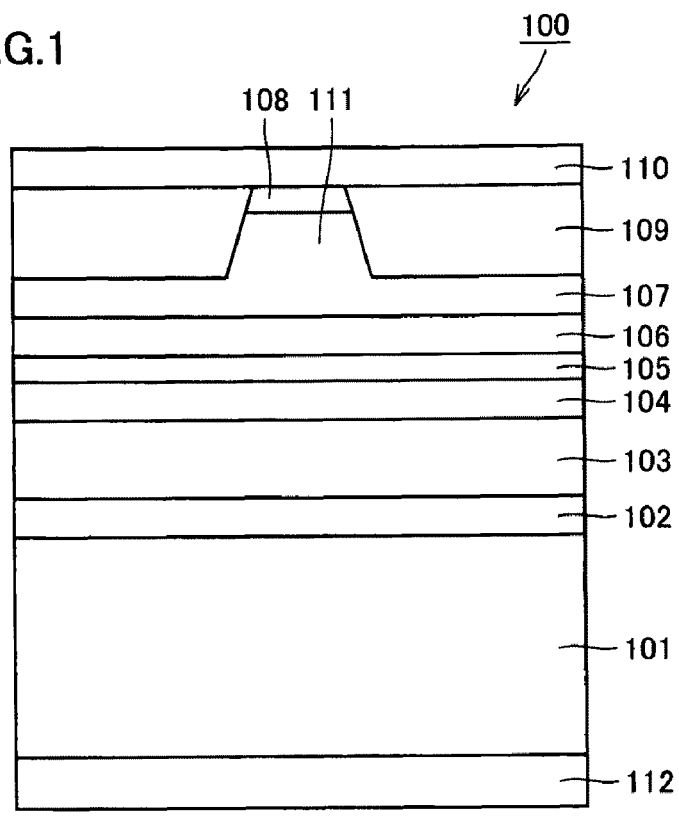
FIG. 1 is a cross section schematically showing a preferable example of a nitride semiconductor laser device in an embodiment.

In the following, embodiments of the present invention will be described. It is noted that the same reference characters represent the same or corresponding parts in the drawings of the present invention.

In order to solve the aforementioned problem, the inventor examined the respective changing COD levels of the conventional nitride semiconductor laser device having the above-noted configuration, after aging under the conditions of low temperature and lower power (30° C., CW drive, optical power 30 mW) and after aging under the conditions of high temperature and high power (70° C., CW drive, optical power 100 mW).

Figure 8:
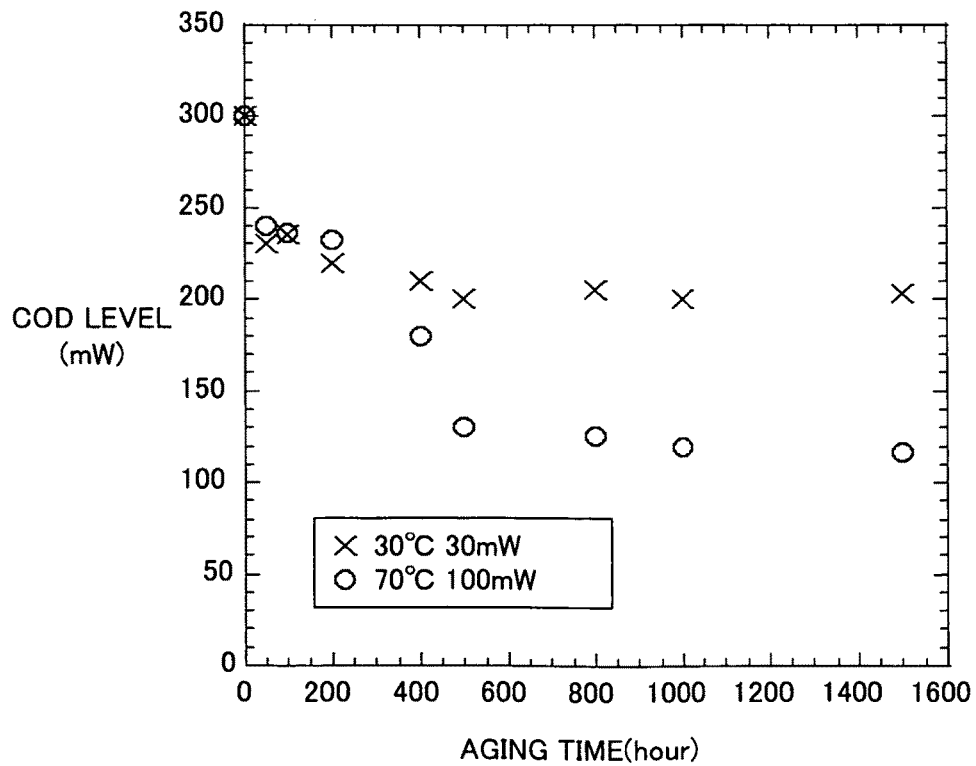
FIG. 8 shows the relation between the aging time and the COD level of a conventional nitride semiconductor laser device.

FIG. 8 shows the relation between the aging time and the COD level of the conventional nitride semiconductor laser device. In FIG. 8, the axis of abscissas shows the aging time and the axis of ordinates shows the COD level. Here, the COD level refers to an optical power value obtained when the light emitting portion suffers COD when the optical power is increased by gradually increasing driving current (CW drive), for each of the nitride semiconductor laser devices after aging with the aging time changed under the conditions as mentioned above.

As shown in FIG. 8, the nitride semiconductor laser device after aging under the conditions of low temperature and low power becomes degraded due to COD of the light emitting portion at the aging time of about 50 hours. However, even after the longer aging time, the COD level scarcely changes.

On the other hand, the nitride semiconductor laser device after aging under the conditions of high temperature and high power becomes degraded due to COD of the light emitting portion at the aging time of about 50 hours. The COD level does not drop largely until the aging time of about 200 hours. However, after the aging time of 400 hours, a large drop of the COD level is observed.

Based on the results as described above, the inventor has found that, in the aging under the conditions of high temperature and high power, the deteriorated reliability of a nitride semiconductor laser device is caused by a drop in the COD level after the aging time of 400 hours.

The inventor thought that oxygen or O—H group in the air transmits through the alumina coat film formed at the facet at the light emitting side to reach the surface of nitride semiconductor crystal forming the facet at the light emitting side, thereby oxidizing the nitride semiconductor crystal, causing deterioration of COD level. In other words, it is thought that it took about 400 hours for oxygen or O—H group in the air to transmit through the 80 nm-thick alumina coat film.

In most cases, the coat film formed at the facet at the light emitting side is grown by EB (Electron Beam) evaporation, sputtering, or any other method. In this case, it is known that the coat film becomes almost amorphous. TEM (Transmission Electron Microscopy) observation was conducted for the facet of the nitride semiconductor laser device after conducting the aforementioned test, to observe the electron diffraction pattern of the coat film. Here, a halo pattern unique to amorphous was seen, and it was confirmed that the coat film was amorphous.

The inventor therefore thought that oxygen or O—H group in the air may easily pass through the amorphous coat film since the amorphous coat film has a low density and includes many defects. Then, as a result of elaborate study, the inventor has found that sufficient reliability can be obtained in high-temperature and high-power drive by forming a coat film including an aluminum nitride crystal or an aluminum oxynitride crystal at a light emitting portion of a nitride semiconductor light emitting device. Thus, the present invention has been completed.

Further, as a result of elaborate study, the inventor has found that the reliability can be further improved in high-temperature and high-power drive when the crystal axis of the aluminum nitride crystal or the aluminum oxynitride crystal in the coat film is aligned with the crystal axis of a nitride semiconductor crystal forming the light emitting portion.

Preferably, in the present invention, the thickness of the coat film is at least 6 nm and at most 150 nm. If the thickness of the coat film is less than 6 nm, the coat film is so thin that transmission of oxygen or the like through the coat film may not be restrained enough. On the other hand, if the thickness of the coat film exceeds 150 nm, the coat film may be cracked since the crystallized coat film has internal stress stronger than the amorphous one.

In the present invention, if the oxygen content in the coat film made of aluminum oxynitride crystal is higher than 35 atomic % of the total atoms that constitute the coat film, the coat film becomes close to the characteristics of alumina, and the crystallinity of the aluminum oxynitride crystal may be lost. Thus, the transmission of oxygen or the like through the coat film may not be restrained enough. Therefore, in the present invention, the oxygen content in the coat film made of aluminum oxynitride crystal is preferably 35 atomic % or less, and more preferably 15 atomic % or less.

Here, the nitride semiconductor light emitting device of the present invention includes, for example, a nitride semiconductor laser device or a nitride semiconductor light emitting diode device. Further, the nitride semiconductor light emitting device of the present invention means a light emitting device including an active layer and a cladding layer formed on a substrate which are formed of a material including 50 mass % or more of a compound made of a group 3 element of at least one kind selected from the group consisting of aluminum, indium and gallium, and nitrogen as a group 5 element.

Furthermore, the nitride semiconductor transistor device of the present invention includes, for example, HFET using nitride semiconductor.

First Embodiment

FIG. 1 is a cross section schematically showing a preferable example of a nitride semiconductor laser device in the present embodiment. Here, a nitride semiconductor laser device 100 in the present embodiment is configured to include a buffer layer 102 having a thickness of 0.2 μm made of n-type GaN, an n-type cladding layer 103 having a thickness of 2.3 μm made of n-type $Al_{0.06}Ga_{0.94}N$, an n-type guide layer 104 having a thickness of 0.02 μm made of n-type GaN, a multiple quantum well active layer 105 made of 4 nm-thick InGaN and 8 nm-thick GaN, a p-type current block layer 106 having a thickness of 20 nm made of p-type $Al_{0.3}Ga_{0.7}N$, a p-type cladding layer 107 having a thickness of 0.5 μm made of p-type $Al_{0.05}Ga_{0.95}N$, and a p-type contact layer 108 having a thickness of 0.1 μm made of p-type GaN, which are stacked on a semiconductor substrate 101 made of n-type GaN in this order from semiconductor substrate 101 by epitaxial growth. Here, the mixed crystal ratio in each of the above-noted layers is adjusted as appropriate and is irrelevant to the essence of the present invention. The wavelength of laser light emitted from the nitride semiconductor laser device in the present embodiment is adjusted, for example, in the range of 370 nm-470 nm as appropriate according to the mixed crystal ratio of multiple quantum well active layer 105. In the present embodiment, the wavelength of laser light was set for 405 nm.

Nitride semiconductor laser device 100 in the present embodiment is formed in such a manner that p-type cladding layer 107 and p-type contact layer 108 are partially removed so that a stripe-like ridge stripe portion 111 extends in the cavity length direction. Here, the width of the stripe of ridge stripe portion 111 is, for example, about 1.2-2.4 μm, typically about 1.5 μm.

A p-electrode 110 made of a multilayer of a Pd layer, an Mo layer and an Au layer on a surface of p-type contact layer 108. An insulating film 109 made of a multilayer of an $SiO_2$ layer and a $TiO_2$ layer is provided under p-electrode 110 at a part excluding the part where ridge stripe portion 111 is formed. In addition, an n-electrode 112 made of a multilayer of an Hf layer and an Al layer is formed on the surface of n-type GaN substrate 101 that is opposite to the side where the above-noted layers are stacked.

Figure 2:
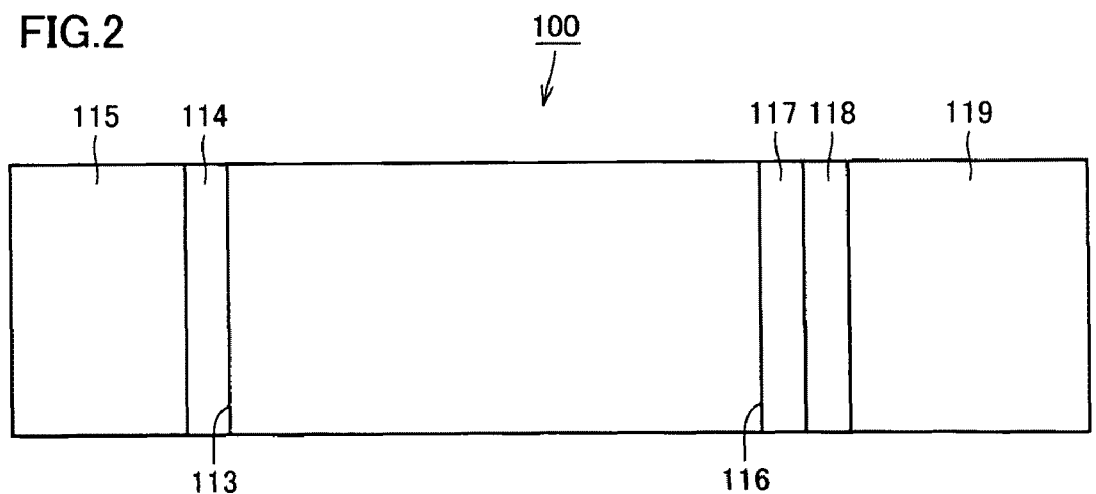
FIG. 2 is a side view schematically showing the nitride semiconductor laser device in the embodiment shown in FIG. 1 in the cavity length direction.

FIG. 2 is a side view schematically showing the nitride semiconductor laser device in the present embodiment shown in FIG. 1 in the cavity length direction. Here, a coat film 114 having a thickness of 6 nm made of aluminum oxynitride represented by a composition formula of $Al_aO_bN_c$ (a+b+c=1, 0<b≦0.35) is formed on a facet 113 at the light emitting side of nitride semiconductor laser device 100 in the present embodiment. An aluminum oxide film 115 having a thickness of 80 nm is formed on coat film 114. Here, in the aforementioned composition formula, Al represents aluminum, O represents oxygen, and N represents nitrogen. Furthermore, in the aforementioned composition formula, a represents a composition ratio of aluminum, b represents a composition ratio of oxygen, and c represents a composition ratio of nitrogen. In the case where the coat film is formed by sputtering, argon may be contained to some degree. However, here, the composition ratio is represented on the basis that argon or the like other than Al, O and N is excluded. In other words, the composition ratios of Al, O and N make up 1 in total.

Furthermore, on a facet 116 at the light reflecting side of nitride semiconductor laser device 100 in the present embodiment, an aluminum oxynitride film 117 having a thickness of 6 nm, an aluminum oxide film 118 having a thickness of 80 nm, and a high reflection film 119 are formed in this order. High reflection film 119 is formed by stacking four pairs of a silicon oxide film having a thickness of 71 nm and a titanium oxide film having a thickness of 46 nm (stacked starting from the silicon oxide film) and thereafter forming a silicon oxide film having a thickness of 142 nm on the outermost surface.

Coat film 114, aluminum oxide film 115, aluminum oxynitride film 117, aluminum oxide film 118, and high reflection film 119 as described above are respectively formed on facet 113 and facet 116 of a sample prepared as follows: a wafer formed by stacking the aforementioned nitride semiconductor layers such as a buffer layer in order on the aforementioned semiconductor substrate, forming a ridge stripe portion, and thereafter forming an insulating film, a p-electrode and an n-electrode is cleaved to expose facet 113 and facet 116 as cleavage surfaces.

Before forming the above-noted coat film 114, an oxide film or impurity attached on facet 113 is preferably removed for cleaning by heating facet 113, for example, at a temperature of 100° C. or higher in a deposition apparatus. However, such cleaning may not be performed in the present invention. Alternatively, facet 113 may be cleaned by irradiating facet 113 with argon or nitrogen plasma. However, such cleaning may not be performed in the present invention. Plasma radiation may be applied while facet 113 is heated. As for the plasma radiation as described above, for example, it is also possible to apply argon plasma and thereafter successively apply nitrogen plasma. Plasma may be applied in the reverse order. Other than argon and nitrogen, for example, such a rare gas as helium, neon, xenon, or krypton may be used.

The aforementioned coat film 114 may be formed for example by ECR (Electron Cyclotron Resonance) sputtering as described below or may be formed by any other sputtering, CVD (Chemical Vapor Deposition), EB (Electron Beam) evaporation, or the like.

Figure 3:
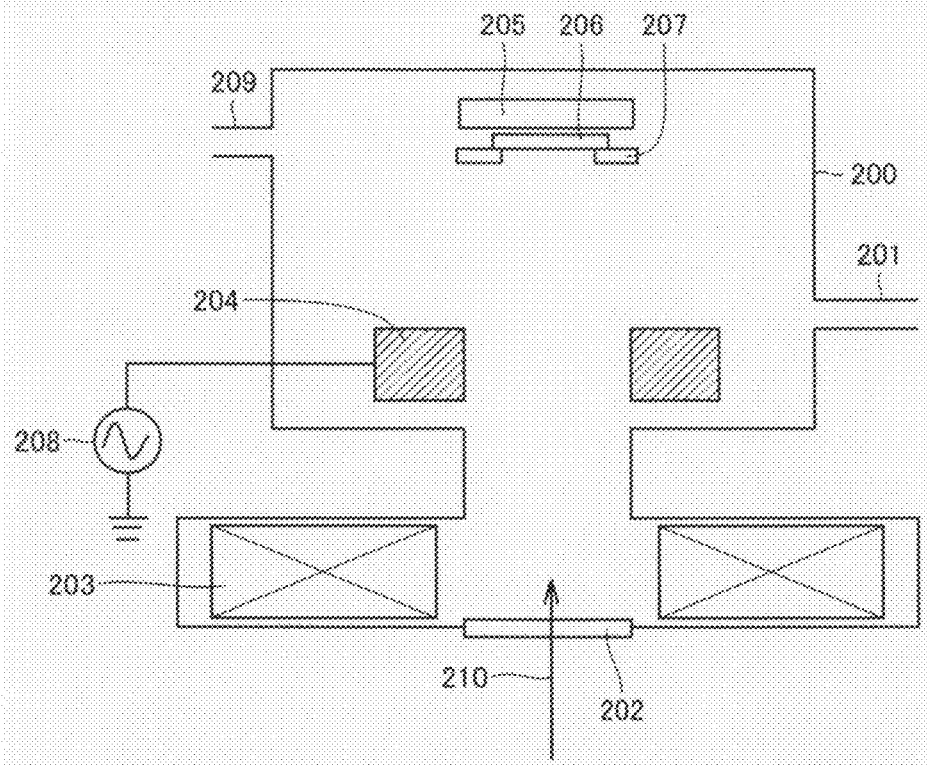
FIG. 3 schematically shows a configuration of an exemplary ECR sputtering deposition apparatus.

FIG. 3 shows a configuration of an exemplary ECR sputtering deposition apparatus. Here, the ECR sputtering deposition apparatus includes a deposition room 200, a magnetic coil 203, and a microwave introduction window 202. Deposition room 200 is provided with a gas inlet 201 and a gas outlet 209. An Al target 204 connected to an RF power supply 208 and a heater 205 are installed in deposition room 200. A sample stage 207 is installed in deposition room 200. A sample 206 as described above is placed on sample stage 207. Here, magnetic coil 203 is provided to produce a magnetic field necessary for generating plasma. RF power supply 208 is used to sputter Al target 204. Further, a microwave 210 is introduced into deposition room 200 through microwave introduction window 202.

Then, nitrogen gas is introduced into deposition room 200 from gas inlet 201 at a flow rate of 5.2 sccm, oxygen gas is introduced at a flow rate of 1.0 sccm, and argon gas is introduced at a flow rate of 20.0 sccm in order to efficiently generate plasma to increase the deposition rate. Here, the oxygen content in the aforementioned coat film 114 can be changed by changing the ratio between nitrogen gas and oxygen gas in deposition room 200. In addition, RF power of 500 W is applied to Al target 204 in order to sputter Al target 204. If 500 W of microwave power necessary for generating plasma is applied, coat film 114 made of aluminum oxynitride with refractive index of 2.1 for light having a wavelength of 405 nm can be formed at a deposition rate of 1.7 Å/second. The respective contents (atomic %) of aluminum, nitrogen and oxygen which constitute coat film 114 can be measured for example by AES (Auger Electron Spectroscopy). The content of oxygen constituting coat film 114 may also be measured by TEM-EDX (Transmission Electron Microscopy-Energy Dispersive X-ray Spectroscopy).

The composition of aluminum oxynitride separately prepared under the same conditions as described above was analyzed in the thickness direction by AES. As a result, it was found that the aluminum oxynitride had an approximately uniform composition in the thickness direction with an aluminum content of 34.8 atomic %, an oxygen content of 3.8 atomic % and a nitrogen content of 61.4 atomic %. Here, an extremely small amount of argon was also detected. Here, argon was present since part of argon gas introduced into deposition room 200 for sputtering Al target 204 was taken in. The argon content in coat film 114 is in the range greater than 0 atomic % and less than 5 atomic % where the total atoms of aluminum, oxygen, nitrogen and argon in coat film 100 make up 100 atomic %. The argon content is usually about 1 atomic % or higher and 3 atomic % or lower, although the present invention is not limited thereto.

Furthermore, aluminum oxide film 115 at the light emitting side and aluminum oxynitride film 117, aluminum oxide film 118 and high reflection film 119 at the light reflecting side can also be formed by ECR sputtering, similarly to the aforementioned coat film 114. Preferably, cleaning by heating and/or cleaning by plasma radiation are also performed before formation of these films. Here, degradation of the light emitting portion is significant at the light emitting side where optical density is high, while the degradation is often insignificant at the light reflecting side where optical density is low as compared with the light emitting side. Therefore, in the present invention, such a film as an aluminum oxynitride film may not be provided on facet 116 at the light reflecting side. Here, in the present embodiment, aluminum oxynitride film 117 having a thickness of 6 nm is formed on facet 116 at the light reflecting side. However, the thickness of aluminum oxynitride film 117 may be increased, for example, to 50 nm.

Furthermore, a heating process may be performed after the above-noted film is formed on the facet. This may promise removal of moisture contained in the above-noted film and improvement in film quality.

In this manner, coat film 114 and aluminum oxide film 115 are formed in this order on facet 113 at the light emitting side of the aforementioned sample, and aluminum oxynitride film 117, aluminum oxide film 118 and high reflection film 119 are formed in this order on facet 116 at the light reflecting side. The sample is thereafter divided into chips, resulting in a nitride semiconductor laser device in the present embodiment.

Figure 4:
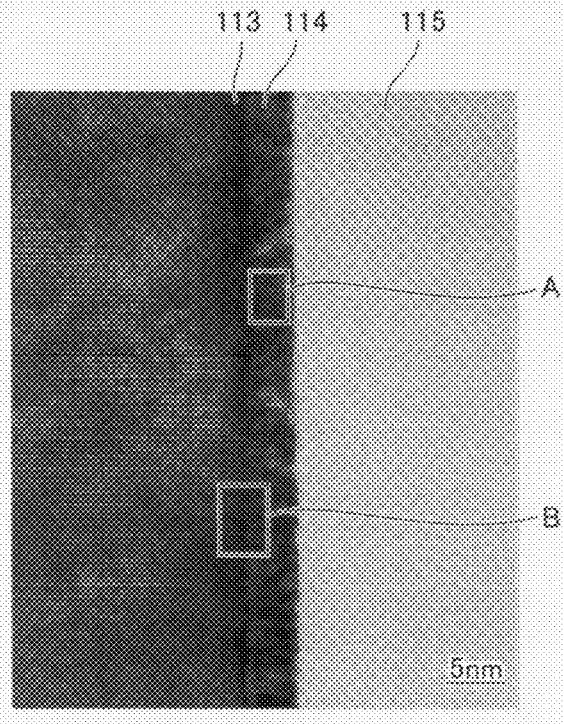
FIG. 4 is a TEM photograph in the vicinity of a facet at the light emitting side of the nitride semiconductor laser device in the first embodiment.
Figure 5:
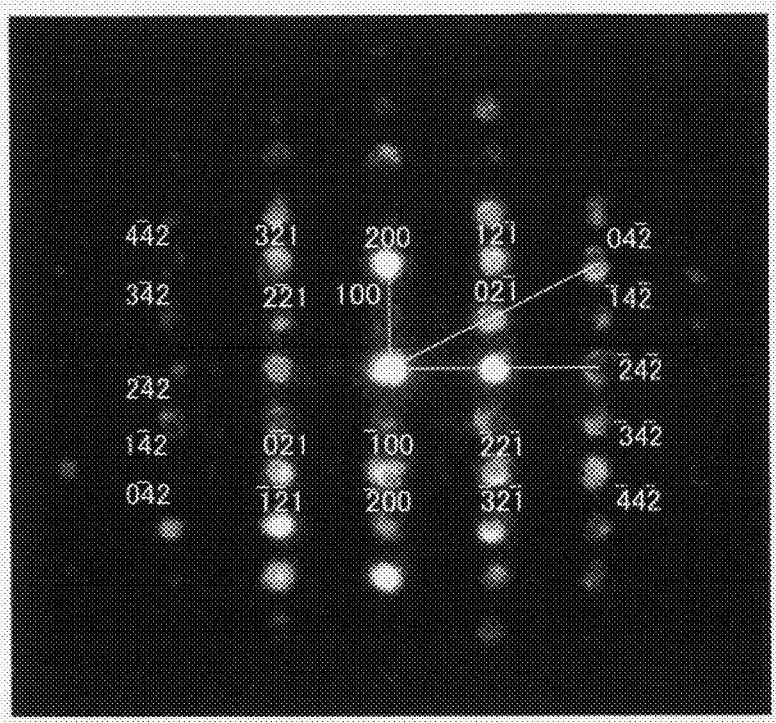
FIG. 5 shows an electron diffraction pattern by TEM at a region A shown in FIG. 4.
Figure 6:
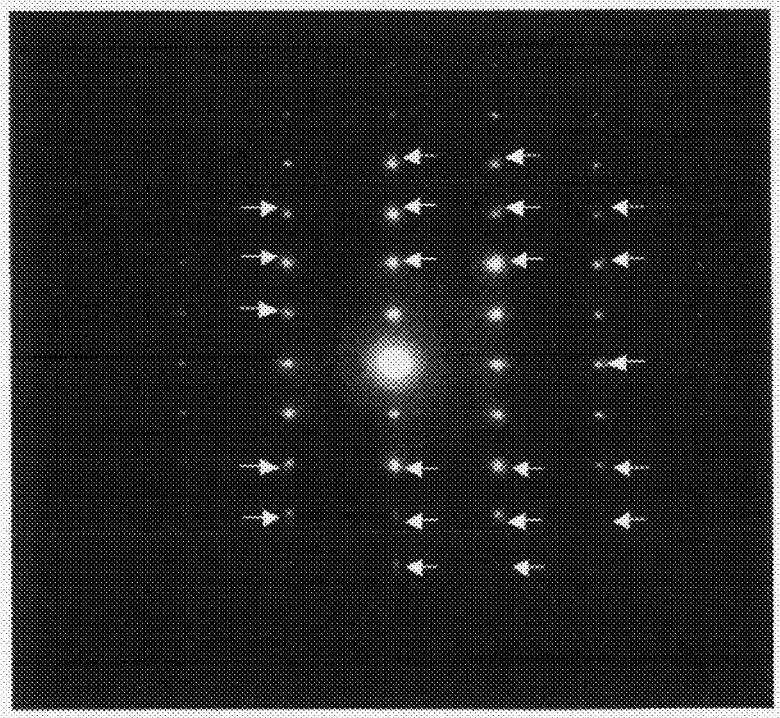
FIG. 6 shows an electron diffraction pattern by TEM at a region B shown in FIG. 4.

FIG. 4 shows a TEM photograph of the nitride semiconductor laser device in the present embodiment in the vicinity of the facet at the light emitting side. FIG. 5 shows an electron diffraction pattern by TEM at a region A shown in FIG. 4, and FIG. 6 shows an electron diffraction pattern by TEM at a region B shown in FIG. 4. Region B shown in FIG. 4 extends across the two regions, namely facet 113 and coat film 114 at the light emitting side. In FIG. 6, the spot size is reduced in order to separate diffraction images from these two regions from each other.

As shown in FIG. 5, since in this electron diffraction pattern, the diffraction spots are scattered, it is understood that the part of region A of coat film 114 made of aluminum oxynitride is crystallized.

Here, the arrow shown in FIG. 6 indicates a diffraction spot of coat film 114 in region B. As shown in FIG. 6, the diffraction spots of coat film 114 are almost in agreement with the diffraction spots of nitride semiconductor crystal forming facet 113 at the light emitting side. Therefore, it was determined that the crystal axis of nitride semiconductor crystal forming facet 113 at the light emitting side is aligned with the crystal axis of aluminum oxynitride crystal forming coat film 114.

Here, strictly speaking, FIG. 6 does not compare the diffraction spots between the light emitting portion of the nitride semiconductor laser device of the present embodiment and coat film 114. However, since facet 113 at the light emitting side is a facet of a wafer formed by epitaxially growing nitride semiconductor layers in order, it can be assumed that all the crystal axes of nitride semiconductor crystals forming facet 113 at the light emitting portion are aligned. Therefore, it can be assumed that the crystal axis of nitride semiconductor crystal forming the light emitting portion which is a part of facet 113 at the light emitting side of the nitride semiconductor laser device of the present embodiment is aligned with the crystal axis of aluminum oxynitride crystal forming coat film 114.

In FIG. 6, the diffraction spots of coat film 114 are almost in agreement with the diffraction spots of nitride semiconductor crystal forming facet 113 at the light emitting side. However, since the nitride semiconductor crystal forming facet 113 at the light emitting side and the aluminum oxynitride crystal forming coat film 114 differ from each other in lattice constant, the locations of these diffraction spots may be shifted to some extent. In addition, at the middle of FIG. 6, the diffraction spot of nitride semiconductor crystal forming facet 113 at the light emitting side appears in a large size and hides the diffraction spot of coat film 114 from view.

Table 1 shows the result of the plane distance in each direction of the aluminum oxynitride crystal forming coat film 114 as obtained from the diffraction spot of coat film 114 shown in FIG. 5. For reference, the plane distance of aluminum nitride crystal shown in JCPD card is also illustrated. Here, the plane distance in the C-axis direction of coat film 114 fabricated in the present embodiment was 2.48 angstroms (Å).

TABLE 1

| Measurement of aluminum oxynitride crystal (Å) | aluminum nitride crystal (JCPDS # 25-1133) | | |
| --- | --- | --- | --- |
| | d(Å) | hkl hkil | zone axis |
| 2.48 | 2.49 | 002 0002 | <100> <2-1-10> |
| 1.19 | 1.19 | 022 02-22 | |
| 1.33 | 1.35 | 020 02-20 | |

Further, the crystal system of aluminum oxide film 115 on coat film 114 was observed by TEM and found to be amorphous.

Figure 7:
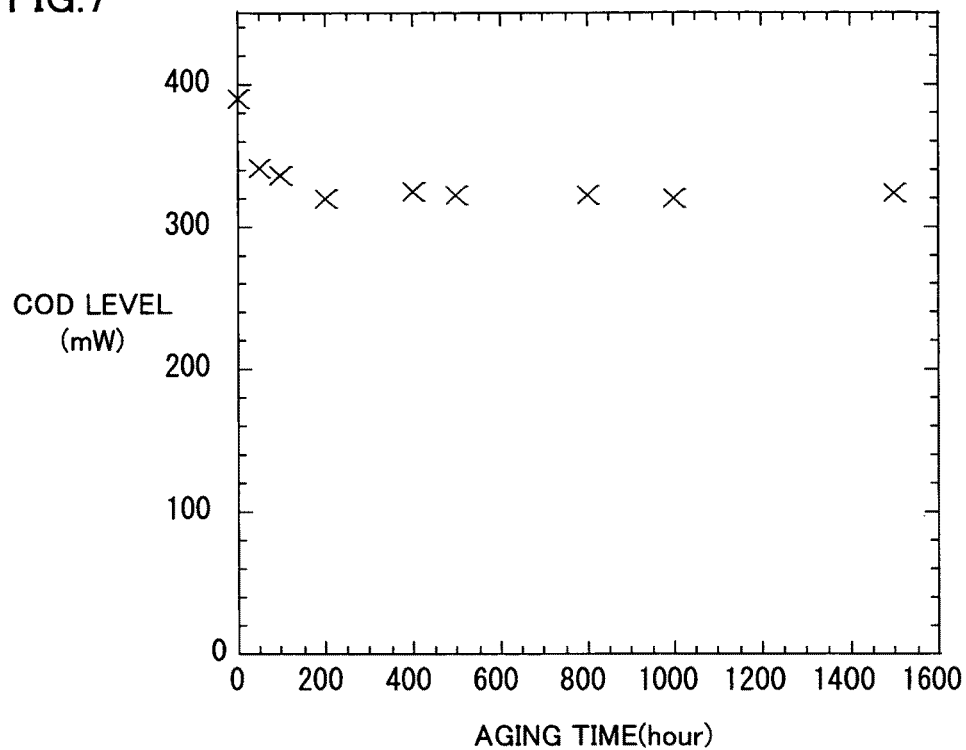
FIG. 7 shows a result of determination of COD levels before aging and after aging for the nitride semiconductor laser device in the first embodiment.

The respective COD levels before aging and after aging (70° C., CW drive, optical power 100 mW) for the nitride semiconductor laser device in the present embodiment were determined. The result is shown in FIG. 7. As shown in FIG. 7, the COD level before aging is about 400 mW, and even after the aging time of 400 hours, the COD level is scarcely reduced.

The reason can be assumed as follows. In the nitride semiconductor laser device in the present embodiment, the aluminum oxynitride crystal forming coat film 114 has such high crystallinity that it looks as if it was epitaxially grown on the nitride semiconductor crystal forming facet 113 at the light emitting side. Such high crystallinity effectively functions as a film that restrains transmission of oxygen, as compared with the amorphous coat film which is thought to include many defects.

In the foregoing description, coat film 114 made of aluminum oxynitride represented by a composition formula $Al_aO_bN_c$ (a+b+c=1, 0<b≦0.35) may be formed by reactive sputtering using a target made of aluminum oxide represented by a composition formula $Al_xO_y$ (0<x<1, 0<y<0.6), instead of Al target 204 shown in FIG. 3, and introducing nitrogen into deposition room 200. In this case, coat film 114 can be formed even without intentionally introducing oxygen or the like into deposition room 200. Since aluminum is relatively oxidizable, it is difficult to control and reproduce the composition of coat film 114 with low oxygen content, if oxygen is introduced. However, if aluminum oxide represented by a composition formula $Al_xO_y$ (0<x<1, 0<y<0.6) is used for a target and only nitrogen is introduced into deposition room 200 without introduction of oxygen, coat film 114 with low oxygen content can be formed relatively easily. Here, a target made of aluminum oxynitride including low oxygen content may be used to achieve the similar effect.

It is noted that in the case where a reactive sputtering apparatus is used, even without using a target made of aluminum oxide, a target having aluminum oxide on a surface of a target made of aluminum can be fabricated by installing a target made of alumina in a deposition room, applying microwave with introduction of oxygen to generate oxygen plasma, and then causing oxygen plasma to oxidize the surface of the target made of alumina.

Alternatively, through the following step 1 and step 2, an aluminum oxynitride film may also be formed using a target made of aluminum.

Step 1

Oxygen gas is introduced in a deposition room of a reactive sputtering apparatus including a target made of aluminum installed therein, and oxygen plasma is generated with application of microwave. The target made of aluminum is exposed to the oxygen plasma, so that aluminum is oxidized by a depth of about a few nm from the surface of the target made of aluminum. A target made of aluminum oxide is thus formed on the surface of the target made of aluminum.

Step 2

Thereafter, nitrogen gas and argon gas are introduced into the deposition room and rendered in a plasma state with application of microwave. Then, the target made of aluminum oxide prepared at step 1 is sputtered. An aluminum oxynitride film can thus be formed.

Here, in the foregoing description, an additional step of exposing the surface of the nitride semiconductor to plasma of argon gas, nitrogen gas or a gas mixture of argon gas and nitrogen gas may be provided between step 1 and step 2

Second Embodiment

A nitride semiconductor laser device in the present embodiment has the similar configuration as that of the nitride semiconductor laser device in the first embodiment, except that a configuration of a film formed on facet 113 at the light emitting side and a configuration of a film formed on facet 116 at the light reflecting side are changed.

In the nitride semiconductor laser device in the present embodiment, coat film 114 having a thickness of 20 nm made of aluminum nitride is formed on facet 113 at the light emitting side, and aluminum oxide film 115 having a thickness of 200 nm is formed on coat film 114.

An aluminum nitride film having a thickness of 12 nm is formed on facet 116 at the light reflecting side, an aluminum oxide film having a thickness of 80 nm is formed on the aluminum nitride film, and a high reflection film is formed on the aluminum oxide film by stacking four pairs of a silicon oxide film having a thickness of 81 nm and a titanium oxide film having a thickness of 54 nm (stacked starting from the silicon oxide film) and thereafter forming a silicon oxide film having a thickness of 162 nm at the outermost surface.

Here, similarly to the first embodiment, the crystal system of coat film 114 was determined by TEM electron diffraction pattern. It was found that coat film 114 was formed of an aluminum nitride crystal. Based on TEM electron diffraction pattern, it was also found that the crystal axis of the aluminum-nitride crystal forming coat film 114 was aligned with the nitride semiconductor crystal forming facet 113 at the light emitting side.

As for the nitride semiconductor laser device in the present embodiment, the COD level after aging (70° C., CW drive, optical power 100 mW) was also examined similarly to the first embodiment. As a result, it was found that the COD level of the nitride semiconductor laser device in the present embodiment was scarcely reduced even after aging for 400 hours.

Third Embodiment

A nitride semiconductor laser device in the present embodiment has the similar configuration as that of the nitride semiconductor laser device in the first embodiment, except that a configuration of a film formed on facet 113 at the light emitting side and a configuration of a film formed on facet 116 at the light reflecting side are changed.

In the nitride semiconductor laser device in the present embodiment, coat film 114 having a thickness of 40 nm made of aluminum oxynitride represented by a composition formula $Al_{0.30}O_{0.11}N_{0.56}$ is formed on facet 113 at the light emitting side, and aluminum oxide film 115 having a thickness of 240 nm is formed on coat film 114.

An aluminum nitride film having a thickness of 12 nm is formed on facet 116 at the light reflecting side, an aluminum oxide film having a thickness of 80 nm is formed on the aluminum nitride film, and a high reflection film is formed on the aluminum oxide film by stacking four pairs of a silicon oxide film having a thickness of 81 nm and a titanium oxide film having a thickness of 54 nm (stacked starting from the silicon oxide film) and thereafter forming a silicon oxide film having a thickness of 162 nm at the outermost surface.

Here, similarly to the first embodiment, the crystal system of coat film 114 was determined by TEM electron diffraction pattern. It was found that coat film 114 was formed of an aluminum oxynitride crystal. Based on TEM electron diffraction pattern, it was also found that the crystal axis of the aluminum oxynitride crystal forming coat film 114 was aligned with the nitride semiconductor crystal forming facet 113 at the light emitting side.

As for the nitride semiconductor laser device in the present embodiment, the COD level after aging (70° C., CW drive, optical power 100 mW) was also examined similarly to the first embodiment. As a result, it was found that the COD level of the nitride semiconductor laser device in the present embodiment was scarcely reduced even after aging for 400 hours.

Fourth Embodiment

A nitride semiconductor laser device in the present embodiment has the similar configuration as that of the nitride semiconductor laser device in the first embodiment, except that a configuration of a film formed on facet 113 at the light emitting side and a configuration of a film formed on facet 116 at the light reflecting side are changed and that the wavelength of emitted laser light is 460 nm.

In the nitride semiconductor laser device in the present embodiment, only coat film 114 having a thickness of 50 nm made of aluminum oxynitride is formed on facet 113 at the light emitting side, with reflectivity of about 10%.

An aluminum oxynitride film having a thickness of 6 nm is formed on facet 116 at the light reflecting side, an aluminum oxide film having a thickness of 80 nm is formed on the aluminum oxynitride film, and a high reflection film is formed on the aluminum oxide film by stacking four pairs of a silicon oxide film having a thickness of 81 nm and a titanium oxide film having a thickness of 54 nm (stacked starting from the silicon oxide film) and thereafter forming a silicon oxide film having a thickness of 162 nm at the outermost surface.

Here, similarly to the first embodiment, the crystal system of coat film 114 was determined by TEM electron diffraction pattern. It was found that coat film 114 was formed of an aluminum oxynitride crystal. Based on TEM electron diffraction pattern, it was also found that the crystal axis of the aluminum oxynitride crystal forming coat film 114 was aligned with the nitride semiconductor crystal forming facet 113 at the light emitting side.

As for the nitride semiconductor laser device in the present embodiment, the COD level after aging (70° C., CW drive, optical power 100 mW) was also examined similarly to the first embodiment. As a result, it was found that the COD level of the nitride semiconductor laser device in the present embodiment was scarcely reduced even after aging for 400 hours.

Fifth Embodiment

A nitride semiconductor laser device in the present embodiment has a configuration similar to the nitride semiconductor laser device in the first embodiment except that a configuration of a film formed on facet 113 at the light emitting side and a configuration of a film formed on facet 116 at the light reflecting side are changed.

In the nitride semiconductor laser device in the present embodiment, coat film 114 having a thickness of 50 nm made of aluminum oxynitride represented by a composition formula of $Al_{0.30}O_{0.25}N_{0.45}$ is formed on facet 113 at the light emitting side, and a silicon nitride film having a thickness of 110 nm is formed on coat film 114.

In addition, an aluminum oxynitride film having a thickness of 50 nm is formed on facet 116 at the light reflecting side. A silicon oxide film having a thickness of 50 nm is formed on the aluminum oxynitride film. A high reflection film is formed on the silicon oxide film by stacking six pairs of a silicon oxide film having a thickness of 71 nm and a silicon nitride film having a thickness of 50 nm (stacked starting from the silicon oxide film) and thereafter forming a silicon oxide film having a thickness of 142 nm on the outermost surface.

A silicon nitride film is more resistant to moisture and has lower oxygen permeability than a silicon oxide film (in other words, O—H group and oxygen are less likely to diffuse than in a silicon oxide film). Therefore, formation of a silicon nitride film on coat film 114 increases the likelihood of restraining oxidation of facet 113 at the light emitting side due to transmission of oxygen.

Here, the thickness of the silicon nitride film on coat film 114 is preferably 5 nm or thicker and more preferably 80 nm or thicker. If the thickness of the silicon nitride film on coat film 114 is less than 5 nm, it may be difficult to deposit the film uniformly in the surface of coat film 114. If thicker than 80 nm, the effect of restraining oxygen diffusion may be increased.

Here, similarly to the first embodiment, the crystal system of coat film 114 was determined by TEM electron diffraction pattern. It was found that coat film 114 was formed of an aluminum oxynitride crystal. Based on TEM electron diffraction pattern, it was also found that the crystal axis of the aluminum oxynitride crystal forming coat film 114 was aligned with the nitride semiconductor crystal forming facet 113 at the light emitting side.

As for the nitride semiconductor laser device in the present embodiment, the COD level after aging (70° C., CW drive, optical power 100 mW) was also examined similarly to the first embodiment. As a result, it was found that the COD level of the nitride semiconductor laser device in the present embodiment was scarcely reduced even after aging for 400 hours.

Sixth Embodiment

A nitride semiconductor laser device in the present embodiment has a configuration similar to the nitride semiconductor laser device in the first embodiment except that a configuration of a film formed on facet 113 at the light emitting side and a configuration of a film formed on facet 116 at the light reflecting side are changed.

In the nitride semiconductor laser device in the present embodiment, coat film 114 having a thickness of 30 nm made of aluminum oxynitride represented by a composition formula of $Al_{0.31}O_{0.03}N_{0.66}$ is formed on facet 113 at the light emitting side, a silicon nitride film having a thickness of 140 nm is formed on coat film 114, and a silicon oxide film having a thickness of 140 nm is formed on the silicon nitride film. Here, the respective thicknesses of the silicon nitride film on coat film 114 and the silicon oxide film on the silicon nitride film are preferably 5 nm or thicker. If the respective thicknesses of these films are less than 5 nm, it may be difficult to deposit the film uniformly in the surface.

In addition, an aluminum oxynitride film having a thickness of 50 nm is formed on facet 116 at the light reflecting side. A silicon oxide film having a thickness of 50 nm is formed on the aluminum oxynitride film. A high reflection film is formed on the silicon oxide film by stacking six pairs of a silicon oxide film having a thickness of 71 nm and a silicon nitride film having a thickness of 50 nm (stacked starting from the silicon oxide film) and thereafter forming a silicon oxide film having a thickness of 142 nm on the outermost surface.

Here, similarly to the first embodiment, the crystal system of coat film 114 was determined by TEM electron diffraction pattern. It was found that coat film 114 was formed of an aluminum oxynitride crystal. Based on TEM electron diffraction pattern, it was also found that the crystal axis of the aluminum oxynitride crystal forming coat film 114 was aligned with the nitride semiconductor crystal forming facet 113 at the light emitting side.

As for the nitride semiconductor laser device in the present embodiment, the COD level after aging (70° C., CW drive, optical power 100 mW) was also examined similarly to the first embodiment. As a result, it was found that the COD level of the nitride semiconductor laser device in the present embodiment was scarcely reduced even after aging for 400 hours.

In addition, with an aluminum oxide film having a thickness of 140 nm, in place of the silicon oxide film as the outermost surface layer on the side of facet 113 at the light emitting side of the nitride semiconductor laser device in the present embodiment, the COD level after aging (70° C., CW drive, optical power 100 mW) was also examined as described above. As a result, it was found that the COD level was scarcely reduced even after aging for 400 hours as in the foregoing description.

Seventh Embodiment

A nitride semiconductor laser device in the present embodiment has a configuration similar to the nitride semiconductor laser device in the first embodiment except that a configuration of a film formed on facet 113 at the light emitting side and a configuration of a film formed on facet 116 at the light reflecting side are changed.

In the nitride semiconductor laser device in the present embodiment, coat film 114 having a thickness of 30 nm made of aluminum oxynitride represented by a composition formula of $Al_{0.32}O_{0.08}N_{0.60}$ is formed on facet 113 at the light emitting side, a silicon nitride film having a thickness of 140 nm is formed on coat film 114, and an aluminum oxide film having a thickness of 160 nm is formed on the silicon nitride film.

In addition, an aluminum oxynitride film having a thickness of 50 nm is formed on facet 116 at the light reflecting side. A silicon oxide film having a thickness of 50 nm is formed on the aluminum oxynitride film. A high reflection film is formed on the silicon oxide film by stacking six pairs of a silicon oxide film having a thickness of 71 nm and a silicon nitride film having a thickness of 50 nm (stacked starting from the silicon oxide film) and thereafter forming a silicon oxide film having a thickness of 142 nm on the outermost surface.

Here, similarly to the first embodiment, the crystal system of coat film 114 was determined by TEM electron diffraction pattern. It was found that coat film 114 was formed of an aluminum oxynitride crystal. Based on TEM electron diffraction pattern, it was also found that the crystal axis of the aluminum oxynitride crystal forming coat film 114 was aligned with the nitride semiconductor crystal forming facet 113 at the light emitting side.

As for the nitride semiconductor laser device in the present embodiment, the COD level after aging (70° C., CW drive, optical power 100 mW) was also examined similarly to the first embodiment. As a result, it was found that the COD level of the nitride semiconductor laser device in the present embodiment was scarcely reduced even after aging for 400 hours.

In addition, with a silicon oxide film having a thickness of 140 nm, in place of the aluminum oxide film as the outermost surface layer on the side of facet 113 at the light emitting side of the nitride semiconductor laser device in the present embodiment, the COD level after aging (70° C., CW drive, optical power 100 mW) was also examined as described above. As a result, it was found that the COD level was scarcely reduced even after aging for 400 hours as in the foregoing description.

Eighth Embodiment

A nitride semiconductor laser device in the present embodiment has a configuration similar to the nitride semiconductor laser device in the first embodiment except that a configuration of a film formed on facet 113 at the light emitting side and a configuration of a film formed on facet 116 at the light reflecting side are changed.

In the nitride semiconductor laser device in the present embodiment, coat film 114 having a thickness of 60 nm made of aluminum oxynitride represented by a composition formula of $Al_{0.32}O_{0.08}N_{0.60}$ is formed on facet 113 at the light emitting side, and a silicon oxynitride film having a thickness of 230 nm is formed on coat film 114. Here, the silicon oxynitride film on coat film 114 is represented by a composition formula of $Si_{0.348}O_{0.04}N_{0.612}$. The silicon content was 34.8 atomic %, the oxygen content was 4.0 atomic %, and the nitrogen content was 61.2 atomic %.

In addition, an aluminum oxynitride film having a thickness of 50 nm is formed on facet 116 at the light reflecting side. A silicon oxide film having a thickness of 50 nm is formed on the aluminum oxynitride film. A high reflection film is formed on the silicon oxide film by stacking six pairs of a silicon oxide film having a thickness of 71 nm and a silicon nitride film having a thickness of 50 nm (stacked starting from the silicon oxide film) and thereafter forming a silicon oxide film having a thickness of 142 nm on the outermost surface.

Here, similarly to the first embodiment, the crystal system of coat film 114 was determined by TEM electron diffraction pattern. It was found that coat film 114 was formed of an aluminum oxynitride crystal. Based on TEM electron diffraction pattern, it was also found that the crystal axis of the aluminum oxynitride crystal forming coat film 114 was aligned with the nitride semiconductor crystal forming facet 113 at the light emitting side.

As for the nitride semiconductor laser device in the present embodiment, the COD level after aging (70° C., CW drive, optical power 100 mW) was also examined similarly to the first embodiment. As a result, it was found that the COD level of the nitride semiconductor laser device in the present embodiment was scarcely reduced even after aging for 400 hours.

Ninth Embodiment

A nitride semiconductor laser device in the present embodiment has a configuration similar to the nitride semiconductor laser device in the first embodiment except that a configuration of a film formed on facet 113 at the light emitting side and a configuration of a film formed on facet 116 at the light reflecting side are changed.

In the nitride semiconductor laser device in the present embodiment, coat film 114 having a thickness of 40 nm made of aluminum oxynitride represented by a composition formula of $Al_{0.32}O_{0.08}N_{0.60}$ is formed on facet 113 at the light emitting side, and a zirconium oxide film having a thickness of 100 nm is formed on coat film 114.

In addition, an aluminum oxynitride film having a thickness of 50 nm is formed on facet 116 at the light reflecting side. A silicon oxide film having a thickness of 50 nm is formed on the aluminum oxynitride film. A high reflection film is formed on the silicon oxide film by stacking six pairs of a silicon oxide film having a thickness of 71 nm and a silicon nitride film having a thickness of 50 nm (stacked starting from the silicon oxide film) and thereafter forming a silicon oxide film having a thickness of 142 nm on the outermost surface.

Here, similarly to the first embodiment, the crystal system of coat film 114 was determined by TEM electron diffraction pattern. It was found that coat film 114 was formed of an aluminum oxynitride crystal. Based on TEM electron diffraction pattern, it was also found that the crystal axis of the aluminum oxynitride crystal forming coat film 114 was aligned with the nitride semiconductor crystal forming facet 113 at the light emitting side.

As for the nitride semiconductor laser device in the present embodiment, the COD level after aging (70° C., CW drive, optical power 100 mW) was also examined similarly to the first embodiment. As a result, it was found that the COD level of the nitride semiconductor laser device in the present embodiment was scarcely reduced even after aging for 400 hours.

Tenth Embodiment

A nitride semiconductor laser device in the present embodiment has a configuration similar to the nitride semiconductor laser device in the first embodiment except that a configuration of a film formed on facet 113 at the light emitting side and a configuration of a film formed on facet 116 at the light reflecting side are changed.

In the nitride semiconductor laser device in the present embodiment, coat film 114 having a thickness of 50 nm made of aluminum nitride is formed on facet 113 at the light emitting side, and a silicon nitride film having a thickness of 140 nm is formed on coat film 114.

In addition, an aluminum nitride film having a thickness of 50 nm is formed on facet 116 at the light reflecting side. A silicon oxide film having a thickness of 50 nm is formed on the aluminum nitride film. A high reflection film is formed on the silicon oxide film by stacking six pairs of a silicon oxide film having a thickness of 71 nm and a silicon nitride film having a thickness of 50 nm (stacked starting from the silicon oxide film) and thereafter forming a silicon oxide film having a thickness of 142 nm on the outermost surface.

Here, similarly to the first embodiment, the crystal system of coat film 114 was determined by TEM electron diffraction pattern. It was found that coat film 114 was formed of an aluminum nitride crystal. Based on TEM electron diffraction pattern, it was also found that the crystal axis of the aluminum nitride crystal forming coat film 114 was aligned with the nitride semiconductor crystal forming facet 113 at the light emitting side.

As for the nitride semiconductor laser device in the present embodiment, the COD level after aging (70° C., CW drive, optical power 100 mW) was also examined similarly to the first embodiment. As a result, it was found that the COD level of the nitride semiconductor laser device in the present embodiment was scarcely reduced even after aging for 400 hours.

As in the nitride semiconductor laser device in the present embodiment, in the case where coat film 114 made of an aluminum nitride crystal which is crystallized with the crystal axis aligned with the nitride semiconductor crystal forming facet 113 at the light emitting side is formed on facet 113 at the light emitting side formed of a nitride semiconductor crystal, the film formed on coat film 114 is preferably a silicon nitride film, a silicon oxynitride film, or an aluminum oxynitride film, rather than a film made of oxide, in view of improvement in reliability.

Moreover, a visual check was performed for the facet portion of the nitride semiconductor laser device in the present embodiment (the peeling state of the film formed on the facet of the nitride semiconductor laser device was observed by a stereoscopic microscope or the like after division into chips). Here, it was found that in the nitride semiconductor laser device in the present embodiment, peeling of the film formed on the facet at the light emitting side can be reduced, as compared with the nitride semiconductor laser device in the second embodiment which includes an aluminum oxide film formed on coat film 114 made of aluminum nitride.

Here, when a film made of an oxide was formed on coat film 114 made of aluminum nitride, 88% of the total did not suffer peeling of the film (referred to as "yield with respect to peeling film" hereinafter). When a film made of a nitride or an oxynitride was formed on coat film 114 made of an aluminum nitride film, the yield with respect to peeling film was 94% of the total.

Figure 10:
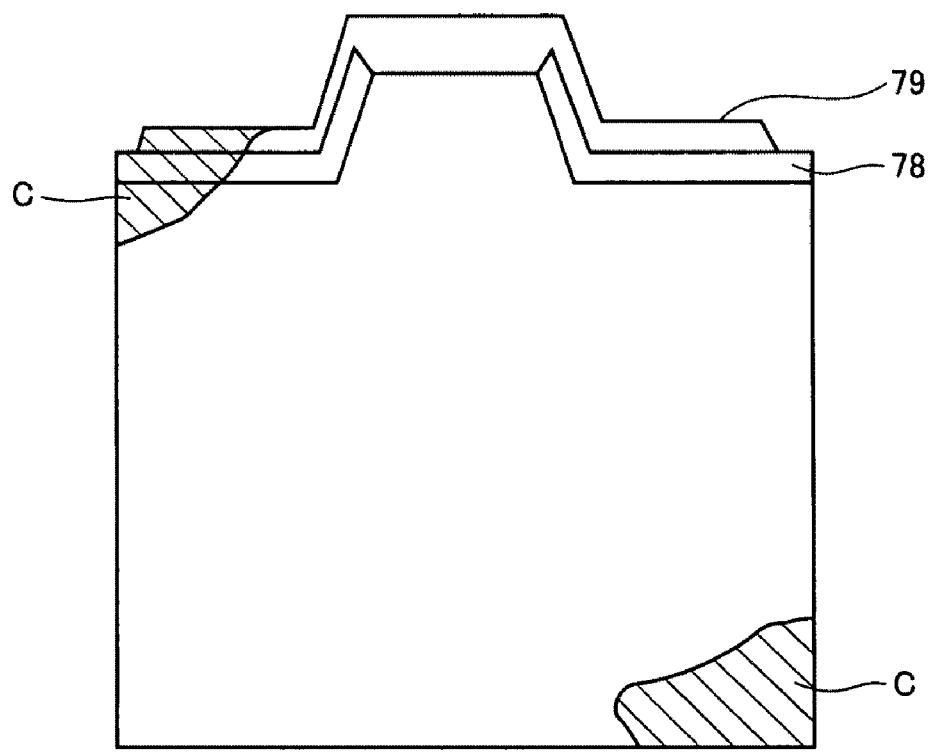
FIG. 10 is a cross section schematically illustrating an example of a peeling film at a facet of the nitride semiconductor laser device.

Such peeling of the film frequently takes place during division into chips, for example, in the region shown by C in the nitride semiconductor laser device shown in the schematic cross section in FIG. 10. The peeling of the film further develops in the following mount step and/or aging test, resulting in defectives. It is noted that the nitride semiconductor laser device shown in FIG. 10 has an insulating film 78 made of a multilayer of an SiO$_2$ layer and a TiO$_2$ layer for current constriction and a p-side electrode 79 for injecting current.

In view of the foregoing, in the case where coat film 114 is made of aluminum nitride, the film formed on coat film 114 is more preferably a nitride or an oxynitride. In the case where coat film 114 is made of aluminum oxynitride, any difference in the yield with respect to peeling film, which is attributable to a difference in material of the film on coat film 114 as describe above, was not seen. Thus, it can be thought that the aluminum oxynitride forming coat film 114 may alleviate a difference in thermal expansion coefficient and internal stress.

Furthermore, the yield with respect to peeling film in the facet of the aforementioned nitride semiconductor laser device can be improved by fabricating insulating film 109 shown in FIG. 1 and insulating film 78 shown in FIG. 10 for current constriction in the process of the first to tenth embodiments.

In a nitride semiconductor laser device, peeling of a film in the vicinity of the ridge stripe portion is most significant. It is found that when the insulating film formed beside the ridge stripe portion is in contact with the film formed on the facet, peeling of the film in the vicinity of the ridge stripe portion can be prevented effectively. This may be because distortion is alleviated at the part where the insulting film is in contact with the film formed on the facet. Here, if the insulating film is not in contact with the film formed on the facet, the yield with respect to peeling film is reduced to about 60% of the total.

The insulating film formed beside the ridge stripe portion includes, for example, a film made of an oxide (an oxide of silicon, zirconium, tantalum, yttrium, hafnium, aluminum, gallium, or the like), a nitride (a nitride of aluminum, silicon or the like), or an oxynitride (an oxynitride of aluminum, silicon or the like).

It is noted that although in the foregoing first to tenth embodiments, the width of the stripe of ridge stripe portion 111 is illustrated as about 1.2-2.4 μm, the present invention can also suitably be applied to a nitride semiconductor laser device of a broad area type for use in illumination (in which the width of the stripe of ridge stripe portion 111 is about 2-100 μm).

In the foregoing first to tenth embodiments, the formation temperature of coat film 114 is preferably 200° C. or higher. In this case, the crystallinity of the aluminum nitride crystal or the aluminum oxynitride crystal forming coat film 114 can be improved.

If coat film 114 is formed after fabricating an electrode structure and a current-constricting structure as in the foregoing first to tenth embodiments, the formation temperature for coat film 114 is preferably 500° C. or lower in view of preventing breakage of these structures.

As described above, not only when aluminum nitride is used but also when a material containing oxygen such as aluminum oxynitride is used for coat film 114 formed at the light emitting portion made of nitride semiconductor crystal of the nitride semiconductor laser device, these materials may be crystallized so that the crystal axis of the aluminum nitride crystal or the aluminum oxynitride crystal is aligned with the nitride semiconductor crystal of the light emitting portion, thereby improving the COD level of the nitride semiconductor laser device and effectively preventing degradation of the light emitting portion over a long time.

Here, in the foregoing first to tenth embodiments, an n-type GaN substrate is used as semiconductor substrate 101. The present invention is characterized in that coat film 114 is formed at the light emitting portion made of nitride semiconductor crystal, which is made of an aluminum nitride crystal or an aluminum oxynitride crystal with the crystal axis aligned with the nitride semiconductor crystal of the light emitting portion, thereby improving reliability of the nitride semiconductor laser device. Therefore, a substrate made of nitride semiconductor represented by a composition formula of $Al_sGa_tN$ (s+t=1, 0≦s≦1, 0≦t≦1) is preferably used as semiconductor substrate 101. In view of reduction of lattice mismatch with coat film 114 and alleviation of defect or distortion, a nitride semiconductor substrate including aluminum such as an AlN substrate or an AlGaN substrate is preferably used as semiconductor substrate 101.

In the foregoing first to tenth embodiments, a nitride semiconductor laser device is fabricated by stacking nitride semiconductor layers in order on semiconductor substrate made of nitride semiconductor. The surface state of the nitride semiconductor layers stacked on the growth surface of semiconductor substrate 101 is varied according to the growth surface of the nitride semiconductor layers of semiconductor substrate 101, and the crystallinity of coat film 114 formed on the side surface of the nitride semiconductor layers may also be varied. Therefore, it was found that the growth surface of semiconductor substrate 101 of the nitride semiconductor laser device may affect the crystallinity of coat film 114. Here, the growth surface of the nitride semiconductor layers of semiconductor substrate 101 made of nitride semiconductor is preferably C-plane{0001}, A-plane{11-20}, R-plane{1-102}, or M-plane{1-100}, and the off angle of the growth surface is preferably within 2° from any of these crystal planes.

It should be noted that although the crystal plane or direction should basically be represented with any given number denoted by overbar, because of the limited expression, in the present specification, it is represented with "-" preceding any given number, instead of being denoted by overbar.

Further, in the forgoing first to third embodiments, aluminum oxide film 115 is formed on coat film 114 in order to control the reflectivity. Alternatively, for example, at least one kind selected from the group consisting of an oxide film such as an aluminum oxide film, a silicon oxide film, a titanium oxide film, a hafnium oxide film, a zirconium oxide film, a niobium oxide film, a tantalum oxide film or an yttrium oxide film, a nitride film such as an aluminum nitride film or a silicon nitride film, and an oxynitride film such as an aluminum oxynitride film or a silicon oxynitride film having a different composition from that of coat film 114 may be formed. Alternatively, a film may not be formed on coat film 114. Alternatively, a magnesium fluoride (MgF) film may be formed as a film made of fluoride on coat film 114.

For example, an aluminum oxynitride film having an oxygen content of 10 atomic % at a thickness of 20 nm is used as coat film 114, and a silicon nitride film having a thickness of 150 nm is formed on coat film 114. Since a silicon nitride film is resistant to moisture and has low oxygen permeability as described above, formation of a silicon nitride film on coat film 114 formed of an aluminum oxynitride film can restrain oxidation of the light emitting portion due to transmission of oxygen.

In the present invention, in the case where the nitride semiconductor light emitting device is a nitride semiconductor diode device, a coat film including an aluminum nitride crystal or an aluminum oxynitride crystal is formed on a light emitting surface (light extracting surface) of the nitride semiconductor diode device. Here, the light emitting surface refers to a surface from which light is extracted from the nitride semiconductor diode device and may be any of a top surface, a bottom surface and a side surface of the nitride semiconductor diode device. The emission wavelength (the wavelength of light with highest emission intensity) of the nitride semiconductor diode device is not limited, and the present invention may be applicable to the wavelength in the ultraviolet range of about 360 nm or the wavelength in the visible region. Further, for the similar reason as described above, the crystal axis of the aluminum nitride crystal or the aluminum oxynitride crystal of the coat film is preferably aligned with the crystal axis of the nitride semiconductor crystal forming the light emitting surface, and the thickness of the coat film is preferably at least 6 nm and at most 150 nm. In the nitride semiconductor diode device in the present invention, for example, a coat film including an aluminum oxynitride crystal may be formed at a thickness of 6 nm and an aluminum oxide film having a thickness of 80 nm may be formed thereon.

In the present invention, in the case where the coat film is formed of aluminum oxynitride crystal, the oxygen content may vary in a graded manner (the oxygen content gradually decreases or increases from the interface between the light emitting portion and the coat film toward the outermost surface of the coat film). Actually, the oxygen content has variations to some extent in the coat film. Preferably, the oxygen content in the coat film preferably varies in the range of 35 atomic % or lower.

Eleventh Embodiment

Figure 9:
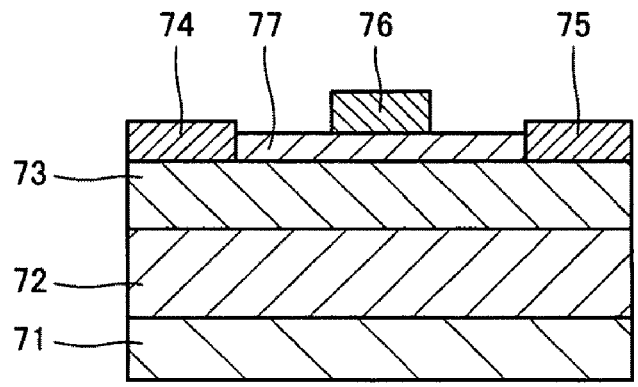
FIG. 9 is a cross section schematically showing a preferable example of a nitride semiconductor transistor device in accordance with the present invention.

FIG. 9 is a cross section schematically showing a preferable example of a MIS-type HFET device as an exemplary nitride semiconductor transistor device in the present invention. Here, the MIS-type HFET device has a configuration in which a GaN layer 72 and an AlGaN layer 73 are stacked in order on a semiconductor substrate 71. Then, a source electrode 74 and a drain electrode 75 are formed spaced apart from each other on AlGaN layer 73. A gate insulating film 77 is formed between source electrode 74 and drain electrode 75. A gate electrode 76 is formed on gate insulating film 77. Here, GaN layer 72 and AlGaN layer 73 each are an example of nitride semiconductor in the present invention.

Here, the MIS-type HFET device in the present embodiment is characterized by using, as gate insulating film 77, a film formed of an aluminum nitride crystal or an aluminum oxynitride crystal with the crystal axis aligned with the nitride semiconductor crystal forming AlGaN layer 73. Accordingly, leak current can be prevented and reliability can be improved. Here, the thickness of gate insulating film 77 is for example about 10 nm, preferably in the range of at least 2 nm and at most 50 nm.

As such gate insulating film 77, for example, a film made of aluminum oxynitride can be used as represented by a composition formula of $Al_d O_e N_f$ (d+e+f=1, 0<e≦0.35). In this composition formula, d represents a composition ratio of aluminum (Al), e represents a composition ratio of oxygen (O), and f represents a composition ratio of nitrogen (N).

Gate insulating film 77 may be formed in a similar method as coat film 114 in the first embodiment.

The present invention provides a nitride semiconductor light emitting device with sufficient reliability even when being driven at high temperature and high power and a method of manufacturing the nitride semiconductor light emitting device, and a nitride semiconductor transistor device with improved reliability.

Moreover, the present invention is applicable to a nitride semiconductor laser device having a window structure at a facet portion including a light emitting portion (for example, such a structure in that the composition of an active layer in the vicinity of the facet for use in a GaAs-based semiconductor laser device is made uniform with an increased bandgap and with improved COD level).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a nitride semiconductor light emitting device including a coat film formed at a light emitting portion, comprising:
    forming said coat film including an aluminum oxynitride crystal at said light emitting portion by electron beam evaporation or sputtering, wherein said nitride semiconductor light emitting device is a nitride semiconductor laser device, and said coat film is formed on a facet at a light emitting side of said nitride semiconductor laser device,
    wherein said coat film is formed by using an aluminum target and introducing nitrogen and oxygen into a deposition room.

2. The method of manufacturing the nitride semiconductor light emitting device according to claim 1, wherein a film made of an oxide is formed on said coat film by electron beam evaporation or sputtering.

3. The method of manufacturing the nitride semiconductor light emitting device according to claim 1, wherein a film made of a nitride is formed on said coat film by electron beam evaporation or sputtering.

4. The method of manufacturing the nitride semiconductor light emitting device according to claim 1, wherein a film made of an oxynitride is formed on said coat film by electron beam evaporation or sputtering.

5. The method of manufacturing the nitride semiconductor light emitting device according to claim 1, wherein a magnesium fluoride film is formed on said coat film by electron beam evaporation or sputtering.

* * * * *